United States Patent [19]

Eltoukhy et al.

[11] Patent Number: 5,508,220

[45] Date of Patent: Apr. 16, 1996

[54] METHOD OF FORMING ANTIFUSES HAVING MINIMUM AREAS

[75] Inventors: Abdelshafy A. Eltoukhy, San Jose; Gregory W. Bakker, Sunnyvale, both of Calif.

[73] Assignee: Actel Corporation, Sunnyvale, Calif.

[21] Appl. No.: 243,001

[22] Filed: Jun. 1, 1993

Related U.S. Application Data

[63] Continuation of Ser. No. 687,437, Apr. 18, 1991, abandoned.

[51] Int. Cl.⁶ .............................. H01L 21/70; H01L 27/00
[52] U.S. Cl. .................... 437/60; 437/922; 148/DIG. 55
[58] Field of Search .............................. 437/228, 52, 60, 437/922; 148/DIG. 55; 257/530

[56] References Cited

U.S. PATENT DOCUMENTS

| | | | |
|---|---|---|---|
| 3,717,852 | 2/1973 | Abbas et al. | 340/173 SP |
| 4,052,208 | 3/1975 | McPherson | 29/584 |
| 4,145,803 | 3/1979 | Tasch, Jr. | 29/571 |
| 4,322,822 | 3/1982 | McPherson | 365/182 |
| 4,651,409 | 3/1987 | Ellsworth et al. | 437/51 |
| 4,800,176 | 1/1989 | Kakumu et al. | 437/193 |
| 4,862,243 | 8/1989 | Welch et al. | 357/51 |
| 4,882,611 | 11/1989 | Blech et al. | 357/51 |
| 4,912,066 | 3/1990 | Wills | 357/51 |
| 4,914,055 | 4/1990 | Gordon et al. | 437/192 |
| 4,997,790 | 5/1991 | Woo et al. | 437/228 |
| 5,011,791 | 4/1991 | Mastroianni | 437/180 |
| 5,057,451 | 11/1991 | McCollum | 437/69 |
| 5,070,384 | 12/1991 | McCollum et al. | 357/51 |
| 5,075,249 | 12/1991 | Sato et al. | 437/52 |
| 5,075,762 | 12/1991 | Kondo et al. | 357/71 |
| 5,120,679 | 6/1992 | Boardman et al. | 437/195 |
| 5,126,290 | 6/1992 | Lowrey et al. | 437/235 |
| 5,166,556 | 11/1992 | Hsu et al. | 307/465 |
| 5,171,715 | 12/1992 | Husher et al. | 437/195 |
| 5,196,724 | 3/1993 | Gordon et al. | 257/530 |

(List continued on next page.)

FOREIGN PATENT DOCUMENTS

| | | |
|---|---|---|
| 0414361 | 2/1991 | European Pat. Off. . |
| 0416903 | 3/1991 | European Pat. Off. . |
| 0436387 | 7/1991 | European Pat. Off. . |
| 0455414 | 11/1991 | European Pat. Off. . |
| 0501120 | 9/1992 | European Pat. Off. . |
| 0501687 | 9/1992 | European Pat. Off. . |
| 60-74669 | 4/1985 | Japan . |
| 64-28937 | 2/1989 | Japan . |
| 8503599 | 8/1985 | WIPO . |
| 9213359 | 8/1992 | WIPO . |
| 9220109 | 11/1992 | WIPO . |
| 9303499 | 2/1993 | WIPO . |

*Primary Examiner*—George Fourson
*Assistant Examiner*—H. Jey Tsai
*Attorney, Agent, or Firm*—D'Alessandro & Ritchie

[57] ABSTRACT

Antifuses having minimum areas are formed by a process including the steps of forming doped regions in a semiconductor substrate, forming a dielectric layer over the surface of the substrate, performing masking and etching steps to form apertures in the dielectric layer over portions of the doped regions where antifuses are to be formed, depositing a second dielectric layer over the first dielectric layer and the apertures, the second dielectric layer having a faster etch rate than the first dielectric layer, etching the second dielectric layer to leave spacers at the edges of the apertures, forming the antifuse dielectric in the apertures, and forming upper antifuse electrodes over the antifuse dielectric. In another process, a process for forming antifuses includes the steps of forming a dielectric layer over the surface of a semiconductor substrate, forming a first layer of polysilicon over the insulating layer, forming apertures in between portions of the first polysilicon layer where antifuses are to be formed, doping the exposed regions in the substrate using the polysilicon as a masking member, depositing an oxide over the polysilicon regions, etching the oxide to expose the substrate between the regions of first layer polysilicon, forming the antifuse dielectric in the apertures, and forming upper antifuse electrodes over the antifuse dielectric. The process of the present invention may also be used to form antifuses in layers above the substrate.

3 Claims, 5 Drawing Sheets

U.S. PATENT DOCUMENTS

| | | | |
|---|---|---|---|
| 5,233,217 | 8/1993 | Dixit et al. | 257/530 |
| 5,241,496 | 8/1993 | Lowrey et al. | 365/96 |
| 5,242,851 | 9/1993 | Choi | 437/49 |
| 5,248,632 | 9/1993 | Tung et al. | 437/195 |
| 5,272,101 | 12/1993 | Forouhi et al. | 437/50 |
| 5,272,666 | 12/1993 | Tsang et al. | 365/96 |
| 5,286,993 | 2/1994 | Lowrey et al. | 257/390 |
| 5,290,734 | 3/1994 | Boardman et al. | 437/195 |
| 5,300,456 | 4/1994 | Tigelaar et al. | 437/195 |
| 5,322,812 | 6/1994 | Dixit et al. | 437/60 |
| 5,353,246 | 10/1994 | Tsang et al. | 365/96 |

METHOD OF FORMING ANTIFUSES HAVING MINIMUM AREAS

This is a continuation of application Ser. No. 07/687,437 filed on Apr. 18, 1991, now abandoned.

BACKGROUND OF THE INVENTION

1. Field of the Invention

The present invention relates to antifuse technology for use in integrated circuit structures. More particularly, the present invention relates to an antifuse having substantially reduced capacitance by forming a minimum size aperture in a semiconductor material for containing the antifuse dielectric, the aperture having a cross section less than the conventional minimum photolithographic feature size, and to a method for manufacturing such an antifuse.

2. The Prior Art

Integrated logic circuits which can be configured or programmed by the user for a specific application are becoming increasingly popular. These circuits are programmed by either selectively breaking or creating a series of programmable links. Programmable links are electrical interconnects which are broken or created as selected electronic nodes in the circuit by the user after the integrated circuit device has been fabricated and packaged. The programming process is used to connect together or to disconnect, respectively, selected electronic nodes such that a user-configurable integrated circuit may be programmed to perform a desired function.

Fusible links formerly were used extensively in PROM and other devices and are well known. A PROM device usually consists of an X-Y matrix or lattice of conductors or semiconductors. At each cross-over point of the lattice, a conducting link connects a transistor or other electronic node to the lattice network. The PROM device is programmed by providing a high programming current to predesignated fusible links which connect to selected nodes. Links are then blown out to create an open circuit. The combination of blown and unblown fusible links represents a digital bit pattern of ones and zeros signifying the logic configuration which the user wishes to store in the PROM device.

Fusible links present several disadvantages. First, significant amounts of current are needed for programming. Fusible link memory cells are also relatively large, thus presenting an inherent limitation on the size of a finished circuit containing large numbers of them. A fusible like cell must be disadvantageously large in order to accommodate the fusible link and an associated selection transistor which develops the high current needed to blow the link.

In order to overcome the foregoing disadvantages of fusible links, another type of programmable link, called an antifuse, has been developed for use in integrated circuit applications. Prior to programming, an antifuse is an open circuit. The programming mechanism for an antifuse creates a short circuit or a relatively low resistance connection between the circuit nodes to which it is connected. Antifuses consist typically conductor electrodes and/or semiconductor electrodes separated by some kind of dielectric or insulating material.

During programming, a current developed from a predetermined programming voltage applied to the electrodes of the selected antifuse causes the dielectric at a selected point between the electrodes to break down, thereby forming a conductive filament electrically connecting the electrodes and forming a short circuit or relatively low resistance link.

If performance of the circuit in which a plurality of antifuses is to be maximized, it is crucial to minimize the capacitance of unprogrammed antifuses. Each unprogrammed antifuse is essentially a capacitor, that is, two electrodes separated by a dielectric material. Therefore, a plurality of unprogrammed antifuses on a single line in the integrated circuit will act as a plurality of capacitors connected in parallel, wherein the capacitance of the line will be the sum of the capacitances of all unprogrammed antifuses. Accordingly, if the total capacitance of a plurality of unprogrammed antifuses in an electronic circuit is large enough, it will deleteriously affect circuit performance. It is therefore essential to minimize the capacitance of each antifuse element in order to insure proper device operation.

In the prior art, the minimum size of an antifuse has essentially been limited by the constraints of the conventional photolithographic process. The most effective way to substantially reduce capacitance in an antifuse element is to reduce the cross sectional area of the antifuse dielectric. In the prior art, the minimum size of an aperture for containing an antifuse dielectric can only be made as small as a conventional photolithographic feature size will allow.

An antifuse may be conventionally fabricated as an extension of a standard CMOS masking process by first forming an N+ diffusion region in a semiconductor substrate. The N+ region defines a first electrode. A silicon dioxide layer is then formed over the substrate and N+ region. In order to produce an aperture for the antifuse dielectric, an aperture is to be formed in the silicon dioxide layer over the N+ region. Using conventional photolithographic techniques, the aperture is patterned using a masking resist placed over the silicon dioxide. Next the silicon dioxide layer in the region of the aperture defined by the resist pattern is etched, using the resist layer as an etch mask. The image of the aperture in the resist is generally larger than the feature size on the glass masking plate due to lateral encroachment of the light during exposure of the mask. In addition, during etching, the undercutting of material by the etchant contributes to creating a larger sized aperture. Accordingly, in the prior art it was not possible to create an aperture for the antifuse dielectric having a size smaller than the minimum photolithographic feature size. The inability of the prior art to provide a method for forming an antifuse aperture smaller than the minimum photolithographic feature size is a significant constraint.

Because the filament created when an antifuse is programmed needs to be only a few hundred angstroms in diameter, an antifuse can theoretically be made smaller than will ever be possible using conventional photolithography. Accordingly, there is a great need for a method for making an aperture for an antifuse as small as possible. This would provide the advantage of potentially eliminating the parasitic capacitance of unprogrammed antifuses.

It is an object of the present invention to provide an electrically programmable low impedance antifuse element having a cross-sectional area smaller than is possible through conventional photolithographic techniques.

Another object of the present invention is to provide a method for making an antifuse having a minimum cross section smaller than that obtainable by conventional photolithographic process steps but which is manufacturable using available semiconductor processing techniques and available semiconductor process modules.

BRIEF DESCRIPTION OF THE INVENTION

According to a first aspect of the present invention, antifuses having minimum areas are formed by a process which includes the steps of forming doped regions in a semiconductor substrate to serve as the lower electrodes for a plurality of antifuses, forming a dielectric layer over the surface of the substrate, forming a layer of polysilicon over the insulating layer, performing masking and etching steps to form apertures in the polysilicon layer over portions of the doped regions where antifuses are to be formed, forming oxide spacers at the edges of the polysilicon at the periphery of the apertures to shrink them in size, forming the antifuse dielectric in the reduced size apertures, and forming upper antifuse electrodes over the antifuse dielectric.

According to a second aspect of the present invention, antifuses having minimum areas are formed by a process which includes the steps of forming a dielectric layer over the surface of a semiconductor substrate, forming a layer of polysilicon over the insulating layer, performing masking and etching steps to form apertures in the polysilicon layer over portions of the substrate where antifuses are to be formed, doping the regions in the substrate exposed by the apertures to serve as the lower electrodes for a plurality of antifuses, forming oxide spacers at the edges of the polysilicon at the periphery of the apertures to shrink them in size, using the oxide spacers and a photolithographic mask as masking members, forming the antifuse dielectric in the reduced size apertures, and forming upper antifuse electrodes over the antifuse dielectric.

According to a third aspect of the present invention, antifuses having minimum areas are formed by a process which includes the steps of forming a conductor in a layer lying over a semiconductor substrate to serve as the lower electrodes for a plurality of antifuses, forming a dielectric layer over the conductor, performing masking and etching steps to form apertures in the dielectric layer over portions of the conductor to define the lower electrodes for a plurality of antifuses, forming oxide spacers at the edges of the dielectric at the periphery of the apertures to shrink them in size, forming the antifuse dielectric in the reduced size apertures, and forming upper antifuse electrodes over the antifuse dielectric.

DETAILED DESCRIPTION OF A PREFERRED EMBODIMENT

Figure 2A:
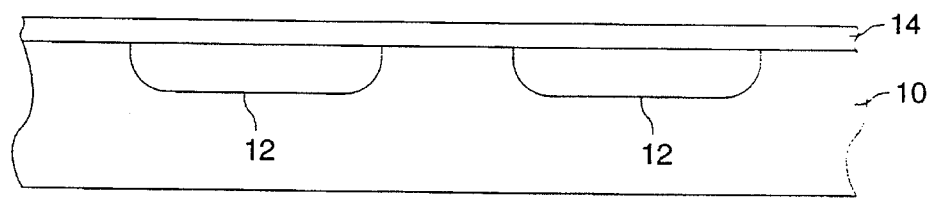
FIGS. 2a–2e are cross sections taken through the line 2—2 the integrated circuit structure of FIG. 1 illustrating the various steps used to fabricate the minimum-area antifuses according to the first aspect of the present invention.

Referring first to FIG. 1 and FIGS. 2a–2e, in a process according to a presently preferred embodiment of a first aspect of the present invention, a region 10 of a semiconductor substrate (typically p-type) has doped regions 12 (typically n-type) formed in it by known semiconductor processing techniques. Next, a dielectric layer 14, such as thermally grown silicon dioxide, is formed over the surface of the semiconductor substrate using conventional processing techniques. FIG. 2a shows a cross section of the structure of FIG. 1 taken through line 2—2 after the dielectric layer 14 has been formed.

Figure 2B:
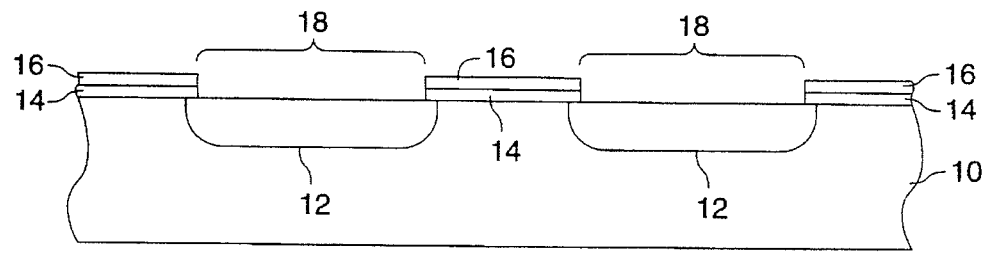

Next, a first layer of polysilicon 16 is formed and defined over the surface of dielectric layer 14 using conventional photolithographic techniques. Well-known photolithography and etching steps are employed to define initial antifuse apertures 18 for a plurality of antifuses by removing the polysilicon and first dielectric in the initial antifuse apertures 18. FIG. 2b shows the structure resulting on the semiconductor substrate 10 after the etching step has been performed.

Figure 2C:
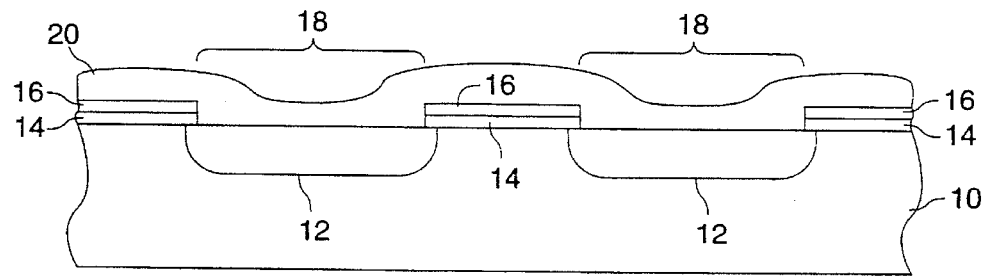

An oxide layer 20 is formed over the surface of the substrate and fills in initial antifuse apertures 18. Oxide layer 20 may be deposited using LPCVD techniques. FIG. 2c shows the structure resulting on the semiconductor substrate 10 after oxide layer 20 has been deposited.

Figure 2D:
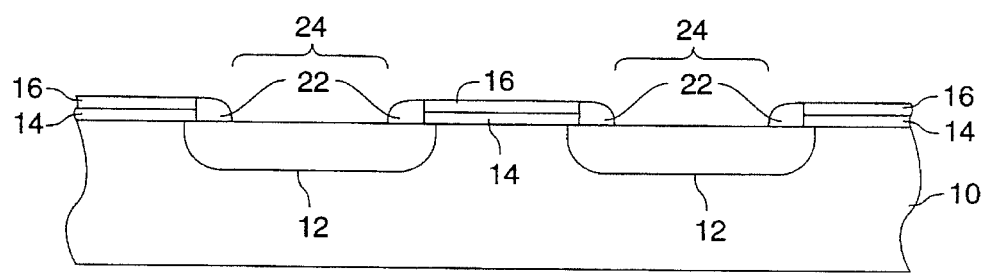
Figure 2E:
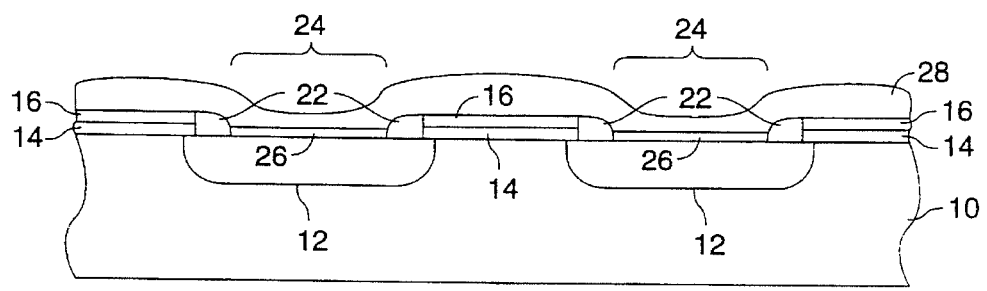

Next, oxide layer 20 is etched back using conventional semiconductor processing techniques. If oxide layer 20 is formed such that it has an etch rate faster than the etch rate of underlying layer 16, the portion of oxide layer 20 in initial antifuse apertures 18 will be removed to expose the surface of substrate 10 without affecting underlying layers 14 and 16. As a result of the etching step, spacers 22 will be formed at the edges of initial antifuse apertures 18, and will define the edges of final antifuse apertures 24. FIG. 2d shows the structure resulting on the semiconductor substrate 10 after oxide layer 20 has been etched to form spacer 24.

The antifuse dielectrics 26 may now be formed in final antifuse apertures 24 using conventional processing techniques for forming antifuse dielectrics. After antifuse dielectrics 26 have been formed, upper electrode 28 for the antifuses is deposited on the structure on the substrate 10 and, if necessary, may be defined using conventional photolithographic and etching techniques. As will be appreciated by those of ordinary skill in the art, upper electrode 28 may be formed from materials such as doped polysilicon or metal/barrier metal layer combinations.

Those of ordinary skill in the art will recognize that a significant reduction in area from the areas of initial antifuse apertures 18 to final antifuse apertures 24 may be accomplished. For example, if a process employing a minimum feature size of 1.0μ is employed, initial antifuse apertures 18 may be formed having areas as small as 1μ$^2$, and final antifuse apertures 24 having areas as small as 0.36μ$^2$ may be formed, if the spacer is 0.2μ wide. The width of the spacer can be adjusted by adjusting the thicknesses of layers 14, 16 and 20. Since antifuse capacitance is directly proportional to the area of final antifuse apertures 24, it can be seen that the present invention provides a way to significantly decrease antifuse capacitance.

The antifuses of the embodiment of the present invention disclosed with respect to FIGS. 1 and 2a–2e can be made to have a low diffusion resistance due to the ability to make wide doped regions 12 in the substrate 10. The antifuse dielectric area is small, resulting in a low capacitance for unprogrammed antifuses. Because there are no field oxide regions between antifuses, there are no underlying field implants, resulting in low diffusion-to-substrate capacitance. First polysilicon region 16 is preferably connected to the same potential as substrate 10 in order to eliminate field inversion leakage between two adjacent diffusions which would otherwise occur due to the formation of a field transistor between doped regions 12 in substrate 10.

Figure 1:
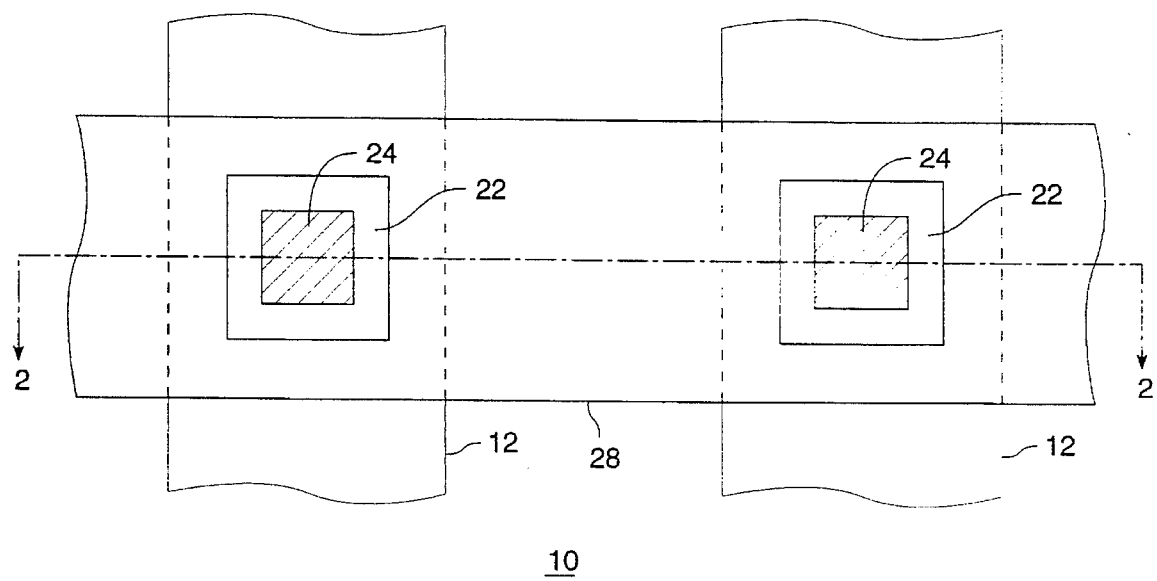
FIG. 1 is a top view of a region of an integrated circuit showing a plurality of antifuses fabricated according to the present invention.
Figure 3:
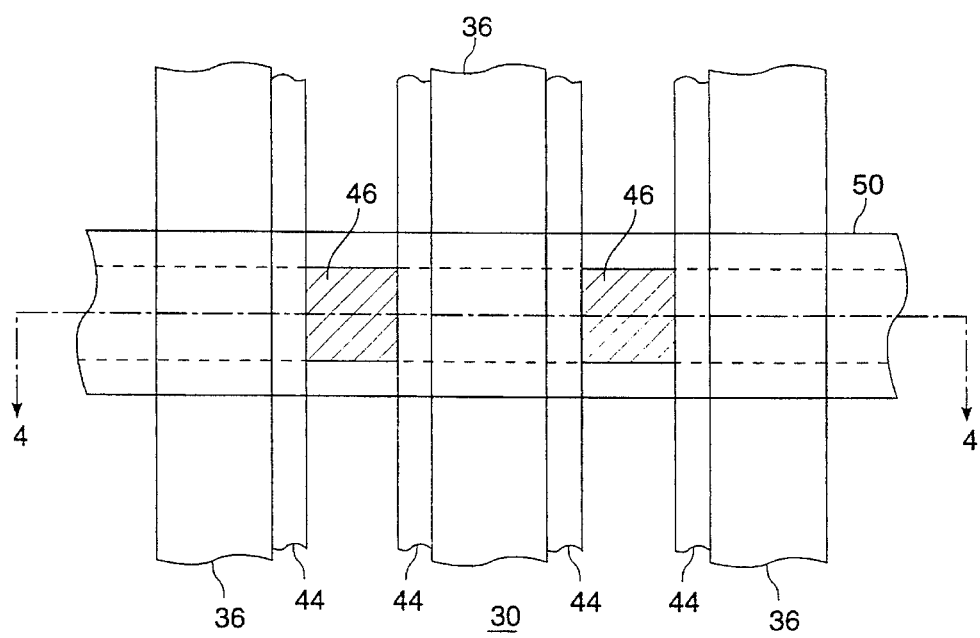
FIG. 3 is a top view of a region of an integrated circuit showing a plurality of antifuses fabricated according to a second aspect of the present invention.

According to a second aspect of the present invention, antifuses having minimal capacitance may be formed using processes in which the doped regions in the substrate are created after one or more polysilicon layers have been formed, such as the well known self aligned gate process. Referring now to FIGS. 3 and 4a–4e, antifuse structures according to the present invention are shown. FIG. 3 is a top view of the structure of a plurality of antifuses fabricated according to this embodiment of the invention and FIGS. 4a–4e show cross sections of the structure of FIG. 3 taken through line 4—4 after various processing steps have been completed.

Figure 4A:
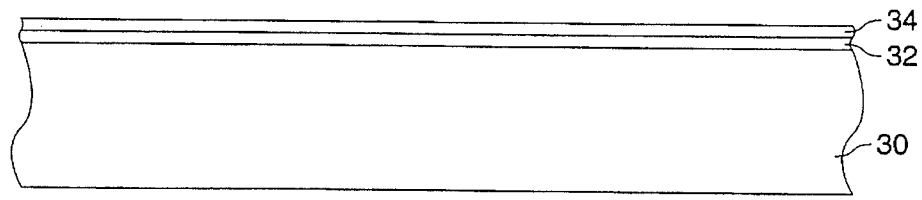
FIGS. 4a–4e are cross sections taken through the region of the integrated circuit structure of FIG. 3 taken through the line 4—4, illustrating the various steps used to fabricate the minimum-area antifuses according to the second aspect of the present invention.
Figure 4B:
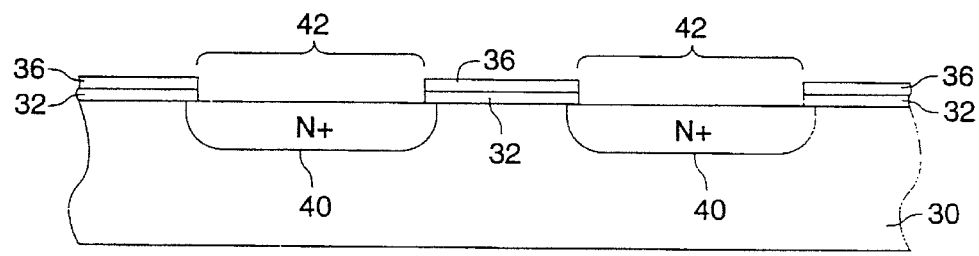

In FIG. 3 and FIGS. 4a–4e, antifuses according to the present invention may be produced by a process in which a region 30 in semiconductor substrate is first covered by a first dielectric layer 32, which may be thermally grown silicon dioxide. A first polysilicon layer 34 is formed over first dielectric layer 12 and is defined into a plurality of stripes 36 using conventional photolithographic and etching steps. The antifuses will be located in the regions 38 between polysilicon stripes 36. FIG. 4a shows the resulting structure on the substrate after the first dielectric layer 32 and the first polysilicon layer 34 have been formed, and FIG. 4b shows the structure after the polysilicon layer 34 and first dielectric layer 32 have been etched away to form polysilicon stripes 36.

Doped regions 40, which will form the lower electrodes for the antifuses, are then formed by conventional processing techniques, such as ion implantation, using layers 32 and 36 as a masking member. Doped regions 40 are formed in initial antifuse 14 apertures 42, shown also in FIG. 4b.

Figure 4C:
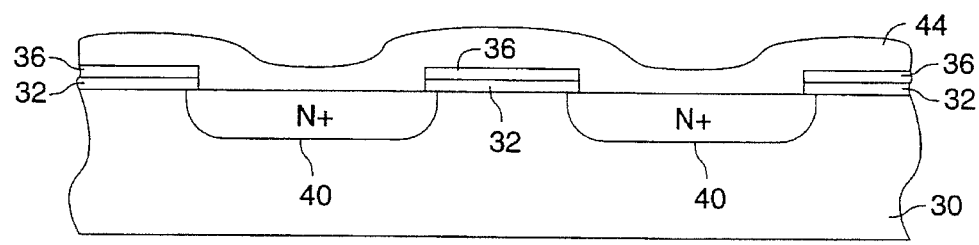

A second dielectric layer 44 preferably formed using LPCVD or LTO techniques or other fabrication techniques such that it will have a faster etch rate than underlying layer 36, is formed next on the surface of the structure. FIG. 4c shows the structure after second dielectric layer 44 has been formed.

Figure 4D:
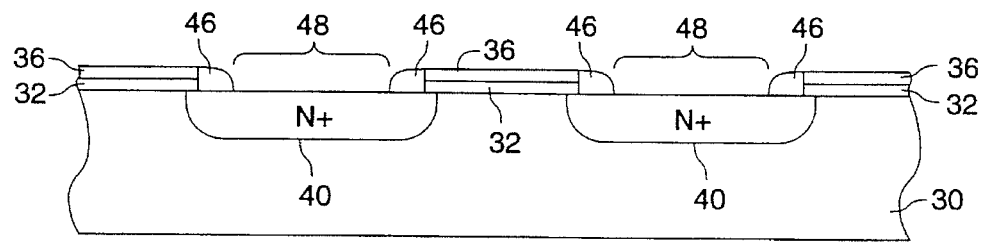

After application of a masking layer shown as dashed lines on FIG. 3, an etching step is performed to remove second dielectric layer 44. Because of the geometry of the structure prior to etching, spacers 46, comprising segments of second dielectric layer 44, remain as a part of the structure. FIG. 4d shows the structure after second dielectric layer 44 has been etched away leaving spacers 46. Spacers 46 act to shrink the size of the antifuse apertures from the size shown at reference numeral 42 in FIG. 4b to the relatively smaller size shown in FIG. 4d at reference numerals 48.

Figure 4E:
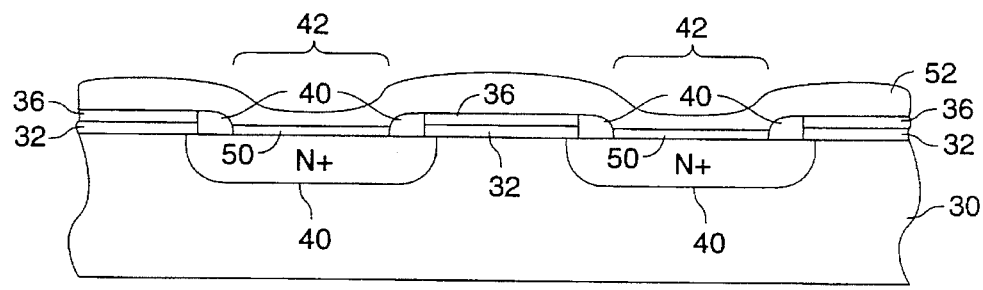
Figure 5:
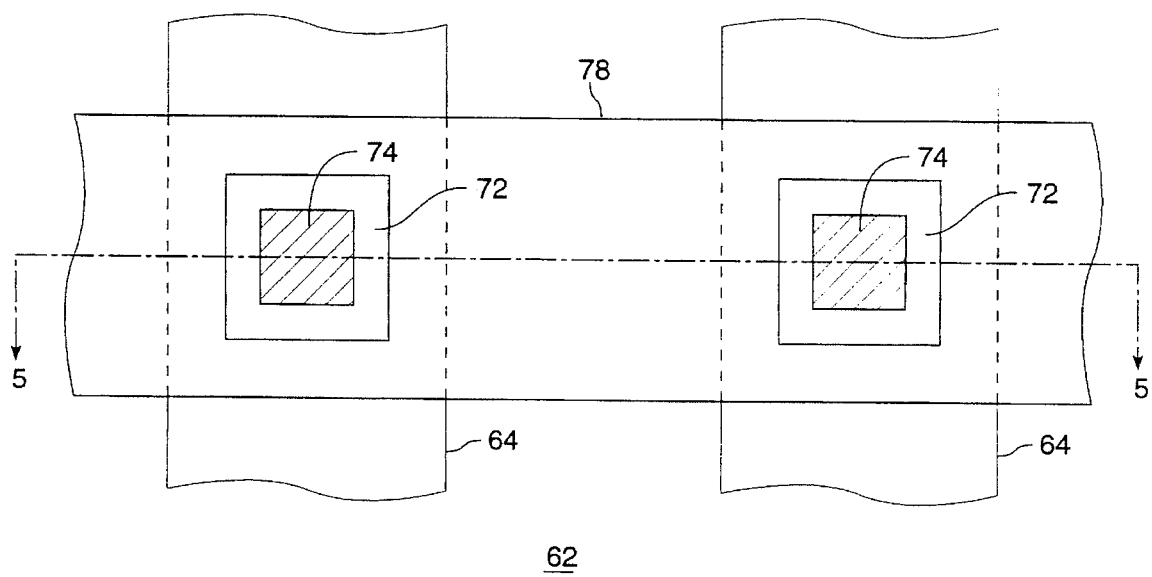
FIG. 5 is a top view of a region of an integrated circuit showing a plurality of antifuses fabricated above a semiconductor substrate according to the present invention.

Next, as shown in FIG. 4e, antifuse dielectric regions 50 are formed in reduced size antifuse apertures 48 over doped regions 40. As in the embodiments disclosed with respect to FIGS. 1 and 2a–2e, antifuse dielectric regions 50 may be formed from a variety of materials or combination of materials known to be useful for this purpose. Upper electrode 52 is next formed over the surface of the structure. Upper electrode 52 may be formed from doped polysilicon or from metal/barrier metal combinations using known processing technology as is known in the art. FIG. 4e shows the structure after upper electrode 52 has been formed.

Those of ordinary skill in the art will recognize that polysilicon stripes 36 should be placed at the same potential as the substrate in order to avoid leakage between two adjacent diffusion regions which could otherwise affect circuit performance by forming field transistors between doped regions 40.

As will be apparent to those of ordinary skill in the art, the invention described in the embodiment of FIGS. 3 and 4a–4e employs self-aligned doped regions and requires no field oxide regions between antifuses, thus allowing a more dense circuit structure to be fabricated. The process according to this embodiment of the invention can easily be incorporated into conventional CMOS processes, since the process steps for creating the first polysilicon layer 34 and defining polysilicon stripes 36 can also be used to form and define polysilicon gates for MOS transistors in other areas on the integrated circuit.

Figure 6A:
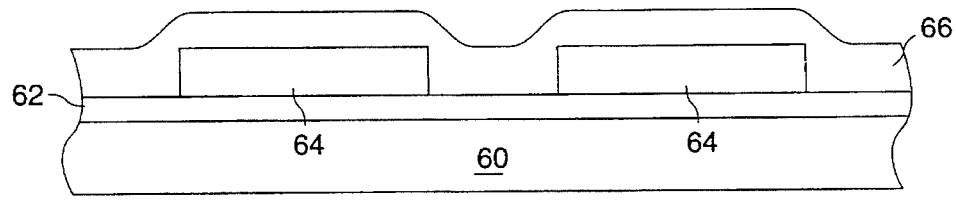
FIGS. 6a–6e are cross sections taken through the line 5—5 region of the integrated circuit structure of FIG. 5 illustrating the various steps used to fabricate the minimum-area antifuses according to the third aspect of the present invention.

Referring now to FIG. 5 and FIGS. 6a–6e, in a process according to a presently preferred embodiment of a third aspect of the present invention, a region 60 of a semiconductor substrate is covered by a dielectric layer 62, upon which a plurality of conductive stripes 64 are formed from a metal, polysilicon, silicide or other conductive material using conventional semiconductor processing techniques. Next, a dielectric layer 66, such as CVD grown silicon dioxide, is formed over the surface of the semiconductor substrate using conventional processing techniques. FIG. 6a shows a cross section of the structure of FIG. 5 taken through line 5—5 after the dielectric layer 66 has been formed.

Figure 6B:
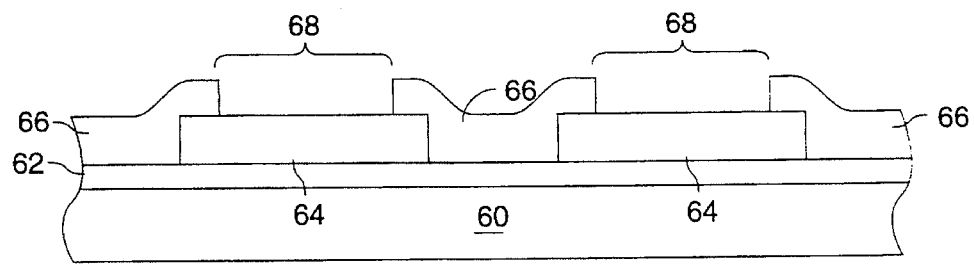

Next, well-known photolithography and etching steps are employed to define initial antifuse apertures 68 for a plurality of antifuses by removing portions of the dielectric layer 66 in the initial antifuse apertures 68. FIG. 6b shows the structure resulting on the semiconductor substrate 60 after the etching step has been performed.

Figure 6C:
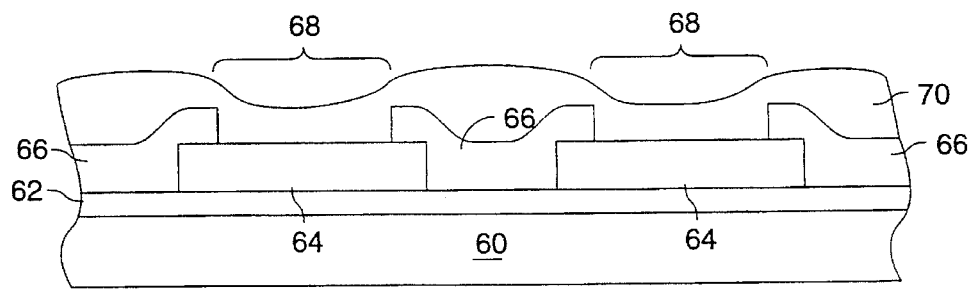

An oxide layer 70 is formed over the surface of the substrate 60 and fills in initial antifuse apertures 68. Oxide layer 70 may be deposited using LPCVD or other well known deposition techniques. FIG. 6c shows the structure resulting on the semiconductor substrate 60 after oxide layer 70 has been deposited.

Figure 6D:
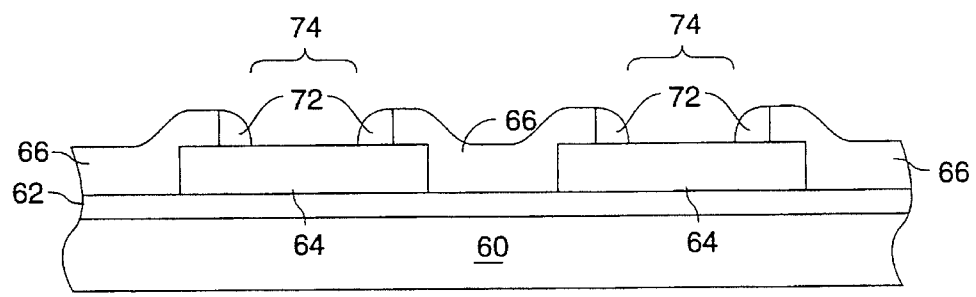

Next, oxide layer 70 is etched back using conventional semiconductor processing techniques. If oxide layer 70 is formed such that it has an etch rate faster than the etch rate of underlying layer 66, the portion of oxide layer 70 in initial antifuse apertures 68 can be removed to expose the surfaces of the lower electrodes comprising conductive stripes 64 without significantly affecting them. As a result of the etching step, spacers 72 will be formed at the edges of initial antifuse apertures 68, and will define the edges of final antifuse apertures 74. FIG. 6d shows the structure resulting on the semiconductor substrate 60 after oxide layer 70 has been etched to form spacers 72.

Figure 6E:
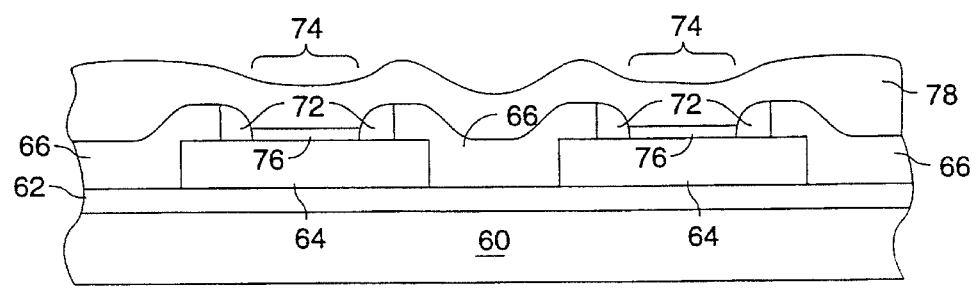

The antifuse dielectrics 76 may now be formed in final antifuse apertures 74 using conventional processing techniques for forming antifuse dielectrics. After antifuse dielectrics 76 have been formed, upper electrode 78 for the antifuses is deposited on the structure on the substrate 60 and, if necessary, may be defined using conventional photolithographic and etching techniques. As will be appreciated by those of ordinary skill in the art, upper electrode 78 may be formed from materials such as doped polysilicon or metal/barrier metal layer combinations. FIG. 6e shows the antifuse structure resulting after upper electrode 78 has been formed.

Those of ordinary skill in the art will recognize that a significant reduction in area from the areas of initial antifuse apertures 68 to final antifuse apertures 74 may be accomplished. For example, if a process employing a minimum feature size of 1.0μ is employed, initial antifuse apertures 68 may be formed having areas as small as 1μ$^2$, and final antifuse apertures 74 having areas as small as 0.36μ$^2$ may be formed, if the spacer is 0.2μ wide. The width of the spacer can be adjusted by adjusting the thicknesses of layers 66 and 70. Since antifuse capacitance is directly proportional to the area of final antifuse apertures 74, it can be seen that the present invention provides a way to significantly decrease antifuse capacitance.

Those of ordinary skill in the art will recognize that the embodiments shown and described herein are illustrative only and that the scope of the invention is not to be limited to the particular embodiments shown and described in the figures and accompanying written disclosure herein. Preferred embodiments of the present invention have been shown and described herein, but from this disclosure, those of ordinary skill in the art will readily be able to comprehend and conceive other embodiments which are variations from the above disclosed embodiments. Such embodiments are meant to fall within the scope of the present invention which is to be limited only by the appended claims.

What is claimed is:

1. A process for fabricating antifuses on a semiconductor substrate including the steps of:

forming doped regions in a semiconductor substrate to serve as lower electrodes for a plurality of antifuses;

forming a first dielectric layer over a surface of said substrate;

forming a polysilicon layer over said first dielectric layer;

forming antifuse apertures in said polysilicon layer and said first dielectric layer at locations above said doped regions;

forming a second dielectric layer over said polysilicon layer and said antifuse apertures, said second dielectric layer characterized by having a faster etch rate than said polysilicon layer;

etching said second dielectric layer to leave spacers at edges of said antifuse apertures to form reduced size antifuse apertures;

forming an antifuse dielectric in said reduced size antifuse apertures; and forming upper antifuse electrodes over said antifuse dielectric.

2. A process for fabricating antifuses on a semiconductor substrate including the steps of:

forming a first dielectric layer over a surface of a semiconductor substrate;

forming and defining polysilicon regions over said insulating layer to form antifuse apertures in areas between said polysilicon regions where antifuses are to be formed;

doping said substrate using said polysilicon regions as a mask;

forming a second dielectric layer over said polysilicon regions;

etching said second dielectric layer in a region to expose said substrate in between said polysilicon regions and form reduced size antifuse apertures, said etching process leaving portions of said second dielectric layer on sides of said polysilicon regions;

forming an antifuse dielectric in said antifuse apertures; and forming upper antifuse electrodes over said antifuse dielectric.

3. A process for fabricating antifuses in layers above and insulated from the surface of a semiconductor substrate including the steps of:

forming a plurality of conductive stripes to serve as lower electrodes for a plurality of antifuses;

forming a first dielectric layer over a surface of said conductive stripes;

forming a plurality of antifuse apertures in said first dielectric layer in regions where antifuses are to be formed, each of said antifuse apertures contacting with one of said conductive stripes;

forming a second dielectric layer over said first dielectric layer and said antifuse apertures, said second dielectric layer characterized by having a faster etch rate than said first dielectric layer;

etching said second dielectric layer to leave spacers at edges of said antifuse apertures to form reduced size antifuse apertures;

forming an antifuse dielectric in said reduced size antifuse apertures; and forming upper antifuse electrodes over said antifuse dielectric.

\* \* \* \* \*